United States Patent [19]

Wong

[11] Patent Number: 4,918,643
[45] Date of Patent: Apr. 17, 1990

[54] METHOD AND APPARATUS FOR SUBSTANTIALLY IMPROVING THE THROUGHPUT OF CIRCUIT SIMULATORS

[75] Inventor: Chiu-Seung R. Wong, Durham, N.C.

[73] Assignee: AT&T Bell Laboratories, Murray Hill, N.J.

[21] Appl. No.: 209,618

[22] Filed: Jun. 21, 1988

[51] Int. Cl.$^4$ ............................ G06G 7/62; G06J 1/00
[52] U.S. Cl. .................................... 364/802; 364/578; 364/608
[58] Field of Search ............... 364/802, 602, 852, 608, 364/578

[56] References Cited

U.S. PATENT DOCUMENTS 3,987,289  10/1976  Bredenkamp .................. 364/852 X
4,414,639  11/1983  Talambiras ..................... 364/608 X

OTHER PUBLICATIONS

*IEEE Power Electronics Specialists Conferences*, IEEE Publication No. 84CH2000-8, "Unified Modelling of Rectifier-Controlled DC Power Supplies", by M. Grojzbach and R. V. Lutz, pp. 304–315, Jun. 1984.

*IEEE Transaction on Aerospace and Electronic Systems*, "Low-Frequency Characterization of Switched dc—dc Converters," by G. W. Wester and R. D. Middlebrook, vol. AES-9, No. 3, pp. 376–385, May 1973.

*IEEE Power Electronics Specialists Conference Record*, IEEE Publication No. 80CH1529-7, "Application of Small-Signal Modeling and Measurement Techniques to the Stability Analysis of an Integrated Switching-Mode Power System," by R. C. Wong et al, pp. 104–118, Jun. 1980.

*IEEE Power Electronics Specialists Conference Record*, IEEE Publication No. 81CH1652-7, "Investigation of Stability and Dynamic Performances of Switching Regulators Employing Current-Injected Control", by F. C. lee and R. A. Carter, pp. 3–13, Jun. 1981.

*IEEE Power Electronics Specialists Conference Record*, IEEE Publication No. 81CH1652-7, "Sampled-Data Modeling of Switching Regulators", by A. R. Brown and R. D. Middlebrook, pp. 349–369, Jun. 1981.

*IEEE Transaction on Industrial Applications*, vol. 1A-15, No. 5, "Computer-Aided Analysis and Simulation of Switched DC-DC Converters", by F. C. Lee and Y. Yu, pp. 511–520, Sep. 1979.

*IEEE Power Electronics Specialists Conference Record*, IEEE Publication No. 84CH2000-8, "A Fast Algorithm for the Time-Domain Simulation of Switched-Mode Piecewise-Linear Systems", by R. C. Wong et al, pp. 281–296, Jun. 1984.

*IEEE Power Electronics Specialists Conference Record*, IEEE Publication No. 85CH2117-0, "Performance-Index Functions as a Simulation Design Tool to Improve the Large-Signal Time-Domain Response of Switch- (List continued on next page.)

Primary Examiner—Joseph Ruggiero
Attorney, Agent, or Firm—Alfred G. Steinmetz

[57] ABSTRACT

A method for substantially improving the throughput of circuit simulators is disclosed for arriving at the steady-state of closed-loop self-regulated piecewise-linear or periodically driven piecewise-linear systems. The disclosed method is based on the Newton-Raphson procedure, which enables it to outperform brute-force methods by an order of magnitude in speed, and a special algorithm for the determination of the system sensitivity, which directs it to converge to the solution of systems with high sensitivity with respect to the subinterval timing, where most of the existing methods fail. The method is an iterative procedure with each iteration starting out with the determination of the sensitivity of the final state vector in a switching cycle with respect to the initial state vector of the same switching cycle. This is followed by a Newton-Raphson iteration to predict the initial state vector of a steady-state operation. The computation of the sensitivity involves the special algorithm to take into account the sensitive variation in subinterval timing with respect to changes in the initial state vector. The iterative process is repeated until the initial state vector and the final state vector are within a user specified tolerance.

7 Claims, 8 Drawing Sheets

OTHER PUBLICATIONS

–Mode Converters", by R. C. Wong et al, pp. 491–501, Jun. 1985.
*IEEE Power Electronics Specialists Conference Record*, IEEE Publication No. 80CH1529-7, "A General Steady-State Analysis Program ANASP for Thyristor Circuits Based on Adjoint-Network Approach", by Y. Kuroe et al, pp. 180–189, Jun. 1980.
*Proceedings of the IEEE*, vol. 60, No. 1, "Steady-State Analysis of Nonlinear Circuits with Periodic Inputs", by T. J. Aprille and T. N. Trick, pp. 108–114, Jan. 1972.
*IEEE Journal of Solid-State Circuits*, vol. SC-8, No. 4, "Fast Periodic Steady-State Analysis for Large-Signal Electronic Circuits", by F. R. Colon and T. N. Trick, Aug. 1973.
*Linear Control Systems, Analysis and Design*, by J. J. D'Azzo and C. H. Houpis, McGraw Hill, 2nd edition, chap. 3, 1981.

PASS NUMBER

○ BRUTE-FORCE SIMULATION
● NEW ALGORITHM

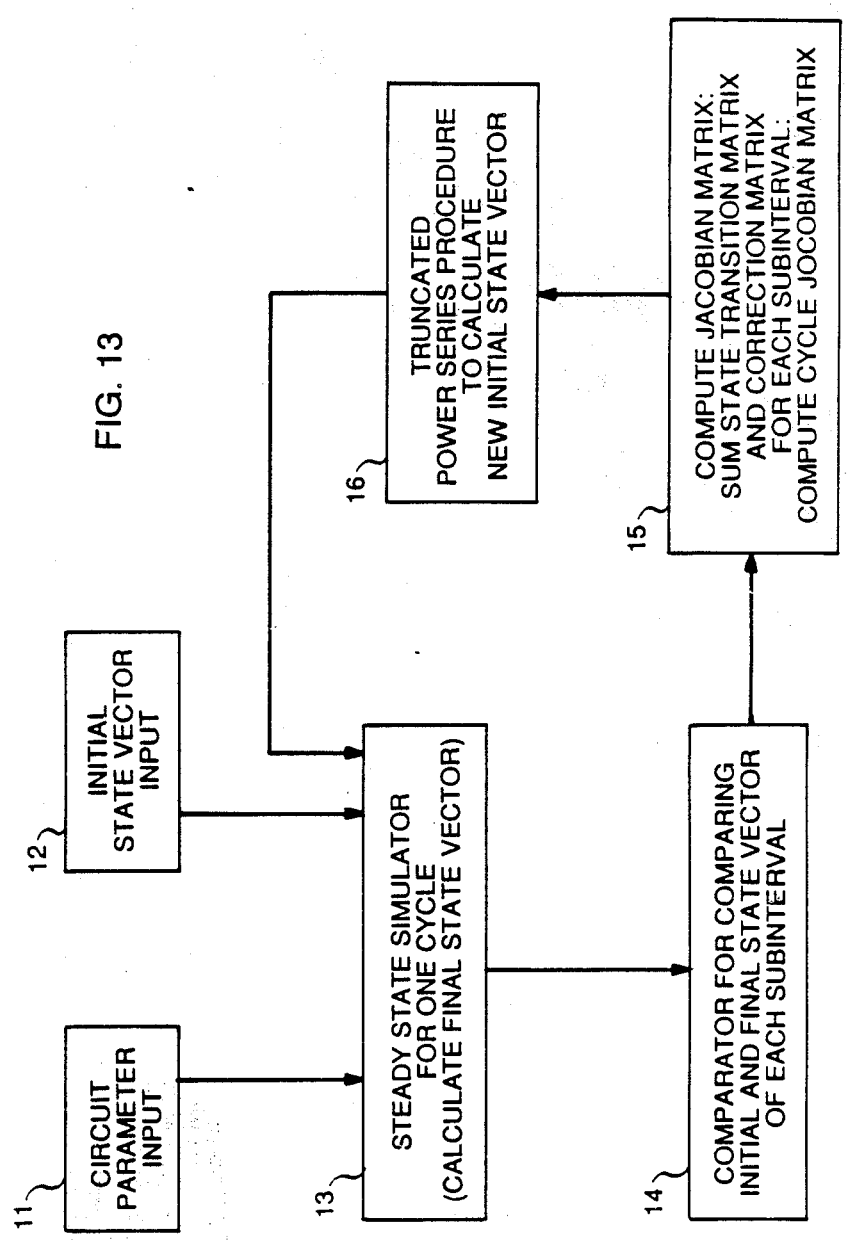

METHOD AND APPARATUS FOR SUBSTANTIALLY IMPROVING THE THROUGHPUT OF CIRCUIT SIMULATORS

TECHNICAL FIELD

1. Field of the Invention

This invention relates to techniques of and apparatus for piecewise-linear modeling and analysis of periodic piecewise-linear systems including closed loop regulated switching mode power systems and periodically driven piecewise-linear systems and in particular is concerned with computation of the steady state operation of such systems. It further concerns achieving accelerated convergence to steady state solutions of periodic piecewise-linear systems by expediting the computation of the sensitivity to subinterval time variations.

2. Background of the Invention

The techniques of piecewise-linear modeling have been widely applied to study and analyze closed-loop regulated switching-mode power systems. One example is the derivation of small-signal models for the power stage of regulated dc-to-dc converters, enabling an engineer to inspect the frequency response of a regulated converter and examine its local stability. Due to specially adapted simulation algorithms, large-signal time-domain simulation of regulated converters through piecewise-linear modeling is becoming available tool to study the long-term transient behavior of regulated converters.

The accuracy of small-signal frequency-domain models hinges upon the accurate determination of the steady-state operating point of the system. Similarly, the accuracy of the computed time-domain large-signal transient response depends upon accurately determining the initial steady-state condition of the system. If the user has a priori knowledge of the system, a steady-state analysis with some simplifying assumptions derived from this knowledge often can be carried out. However, if not much experience has been acquired with the system under study, a brute-force transient simulation with an arbitrarily-set initial operating point is usually carried out until the results of the simulation indicate that the system is sufficiently close to steady-state operation. This is usually a very time-consuming simulation, going through possibly hundreds to thousands of switching cycles, depending on how far the initial operating point is separated from the eventual steady-state operating point.

To make the study of a regulated switching-mode system tractable, the system is often modeled by K different topologies within a switching cycle. The number of topologies K employed in the modeling is a sufficiently large number such that the system description is piecewise-linear in each topology. As a result, the system can be described by a linear vector differential equation and a linear vector algebraic equation for each of the K different topologies.

$$\frac{dx}{dt} = A_k x + B_k u \quad (1)$$

$$1 \leq k \leq K$$

$$y = C_k x + D_k u \quad (2)$$

where x, u, and y are the standard symbols used in control theory for the state vector, the input vector, and the output vector, respectively. It is assumed that there are n state variables in the system. $A_k$, $B_k$, $C_k$, and $D_k$ are matrices which contain numerical entries relating to the component values. These matrices vary from one topology to another. The subscript k is used to indicate that the corresponding matrix is associated with the kth topology.

To keep track of the values of the state variables during one switching cycle, the following convention for symbols is adopted. The symbol $x_{k-1}$ represents the value of the state vector at the entry to the kth topology while the symbol $x_k$ represents the value of the state vector at the exit from the kth topology. Similarly, the symbol $y_{k-1}$ and $y_k$ stand for the value of the output vector at the entry and exit of the kth topology, respectively. The symbol $t_k$ represents the time duration that the system spends in the kth topology. Without any loss of generality, it is assumed that the system enters the 1st topology at the start of a switching cycle, followed by the 2nd, the 3rd, ..., and it is in the Kth topology right before the end of a switching cycle. The waveform of one transient cycle of a first-order switching system with three different topologies is illustrated in FIG. 1. Here the system exhibits three subintervals at operation 101, 102 and 103 each subinterval having a different linear circuit topology in response to circuit switching activity. $X_0$, $X_1$, $X_2$, and $X_3$ are various valves at one state vector at the occurrence of switching. $X_0$ is the entry state vector to subinterval 101 and $X_1$ is the exit state vector to subinterval 101, subinterval 101 has a time duration shown by the duration $t_1$. $X_1$, $X_2$, $X_3$, $t_2$ and $t_3$, are defined in a similar consistent manner with respect to subinterval 102, and 103.

Although the system is switching from one topology to another during normal operation, it reduces to K different linear and time-invariant subsystems through the piecewise-linear modeling in (1) and (2). The solution to (1) can be found in any standard treatise on linear control theory.

The solution of (1), evaluated at the time of exit from the kth topology, is summarized here $$x_k = \phi_k(t_k) x_{k-1} + A_k^{-1} [\phi_k(t_k) - I] B_k u \quad (3)$$

where $$\phi_k(t_k) = e^{A_k t_k} \quad (4)$$

The symbol $\phi_k(t_k)$ stands for the state transition matrix of a square matrix $A_k$ over a time span of $t_k$.

The reason the system exits the kth topology is because a certain output variable, say the qth component of the output vector $y_k$, drops to zero as a signal to change the system topology. For example, when the current through the diode of a voltage step-up (boost) converter drops from a positive value to zero, the converter goes into a new topology in which neither the transister nor the diode is conducting. Using the general symbol $\kappa_q$ to represent the qth row of $\kappa$, where $\kappa$ is either a matrix or a column vector, the time duration $t_k$ can be solved from the relationship $$0 = (y_k)_q \quad (5)$$

$$0 = (C_k)_q x_k + (D_k)_q u$$

$$0 = (C_k)_q (\phi_k(t_k) x_{k-1} + A_k^{-1} [\phi_k(t_k) - I] B_k u) + (D_k)_q u$$

The index q changes from one topology to another since the exit from each topology is normally associated with a different output variable.

Given any initial value $x_i$ to the state vector at the start of a cycle of operation, the final value $x_f$ of the state vector at the end of the same cycle can be computed by sequentially solving for the k time intervals the evaluation of the propagation equation in (3) and the algebraic equation in (5). The $x_k$ vector computed then serves as the initial value of the state vector at the entry to the next topology. According to the convention stated earlier, $x_0$, the state vector at the start of the last topology, is automatically equal to $x_i$. The time duration $t_1$ spent in the 1st topology is determined from (5), and $x_1$, the value of the state vector at the exit of the 1st topology is determined from (3). Similarly, $x_2$ can be computed from the knowledge of $x_1$, $x_3$, from $x_2$, etc. After obtaining $x_k$, the value of the state vector at the exit of the Kth topology, the value of $x_k$ is assigned to $x_f$ because the Kth topology is the last topology in the switching cycle.

A vector function $F(x_i)$, representing the change in the state vector over one switching cycle, is then defined in terms of the initial state vector $x_i$ and the final state vector $x_f$ [8].

$$F(x_i) = x_f - x_i \qquad (6)$$

In steady state, the value of $x_i$ and $x_f$ must be identical, resulting in $F(x_1)$ being equal to the null vector O. The problem of solving for the steady-state condition of a regulated switching-mode system is then reduced to finding the appropriate state vector $x_1$ that leads to $$F(x_1) = O \qquad (7)$$

To distinguish the solution to (7) from any arbitrary value of $X_1$, the symbol $X_I$ is used to represent all solutions to (7), which comprise the steady-state initial state vector. That is, if the simulation is carried out with $X_I$ as the initial value of the state vector at the beginning of a cycle, then the final value $x_f$ of the state vector at the end of the cycle, which is obtained after the system has experienced K different topologies, should be identical to the initial state vector $X_I$. Such a case is illustrated in FIG. 2 for a 3-topology system. The three different topologies are represented by three separate vector trajectories 201, 202 and 203 respectively. Steady state operation is shown in which in initial state vector $x_i$ for a switching cycle is identical to the final store vector $x_f$ in the same cycle. Given any arbitrary value of $x_i$, (7) normally is not satisfied and the function $F(x_i)$ defined in (6) can be regarded as an error function giving an indication of how far away the given $x_i$ is from the steady-state initial state vector $X_I$. The diagram in FIG. 3 represents such a case where the system has not yet reached steady-state operation. The closer $F(x_i)$ is to the null vector O, the closer $x_i$ is to $X_I$. FIG. 3 discloses waveforms or state vector trajectories 301, 302, and 303 for three successive sub intervals or switched topologies. The system has not reached steady state since there is a difference between one initial state vector $x_i$ and the final state vector $x_f$.

Although the error function $F(x_i)$ is defined in terms of a difference between $x_f$ and $x_i$, it is a continuous function in $x_i$ and can be expanded around a small neighborhood of $x_i$ through Taylor series expansion $$F(x_i + \Delta x_i) = F(x_i) + \frac{\partial F(x_i)}{\partial x_i^T} \Delta x_i + \qquad (8)$$

HIGHER-ORDER TERMS IN $\Delta x_i = F(x_i) + J(x_i)\Delta x_i +$

HIGHER-ORDER TERMS IN $\Delta x_i$ where $J(x_i)$ is the Jacobian matrix of the function $F(x_i)$ evaluated at $x_i$. The (p,q) entry of the square matrix $J(x_i)$ is equal to the partial derivative of the pth component in the function F with respect to the qth component in the argument vector $x_i$. The Jacobian matrix $J(x_i)$ is, in essence, a measure of the sensitivity of the steady-state equilibrium condition with respect to the variation in the initial state vector $x_i$.

If the existing value of $x_i$ does not satisfy (7), then a correction vector $\Delta x_i$ must be determined so that $F(x_i + \Delta x_i)$ is equal to the null vector O. In the method of the Newton-Raphson iteration, the higher-order terms in (8) are ignored so that $$O = F(x_i + \Delta x_i) = F(x_i) + J(x_i)\Delta x_i \qquad (9)$$

giving $$\Delta x_i = -[J(x_i)]^{-1} F(x_i) \qquad (10)$$

With the correction vector computed from (10), the simulation can converge to the steady state at an accelerated pace over that of brute-force simulation. The flow chart shown in FIG. 4 discloses the general algorithm or simulation method used to evaluate the steady-state solution to a periodic piecewise-linear system. This process may be embodied in a circuit simulator or a general purpose computer. After this process is initiated in start 401 an initial state vector $x_i$ is selected in 402. A single cycle of operation is simulated in 403 to calculate a final state vector $x_f$. The initial state vector $x_i$ and the final state vector $x_f$ are compared in 404 to see the extent to which they differ. If the difference is acceptably small a decision is made in 405 that steady state has been achieved. If the difference is too great an iterative process is initiated is to adjust the initial state vector $x_i$ by computing a Jacobian matrix $J(x_i)$ and employing a Newton-Raphson iteration in 407 to accelerate convergence toward a steady state solution. In practice, the iteration is stopped not when $x_f$ is equal to $x_i$, but when the error between $x_f$ and $x_i$ is small enough to be acceptable. To meaningfully measure the error between $x_i$ and $x_f$, two vectors having the same dimension as the state vector are introduced. First, a normalizing vector $X_N$ is defined in terms of the expected maximum magnitudes of the state variables. The qth component of $X_N$ is defined as $$(X_N)_q = \text{expected maximum magnitude of } (x)_q \qquad (11)$$

$$\text{during one cycle of operational} \leq q \leq n$$

The choice of the values in $X_N$ depends on the individual system under study and they are assigned by the user. For example, if a capacitor is expected to reach a maximum voltage of 70 V in one switching cycle, the corresponding component in $X_N$ may be assigned a value of 100 V. The user only needs to supply approximate estimates of the entries in $X_N$.

Once the normalizing vector $X_N$ is defined, a relative error vector $E(x_i)$ is defined in terms of $F(x_i)$ and $X_N$, $$(E(x_i))q = (F(x_i))q/(X_N)q \quad 1 < q < n \tag{12}$$

That is, the qth component of $E(x_i)$ is the error between the qth components of $x_i$ and $x_f$, normalized by the qth component of $X_N$. A system under study is considered to be in steady-state when the Euclidean norm of $E(x_i)$, defined as the square root of the sums of the squares of the individual terms in (12), is smaller than a prescribed tolerance $\epsilon$. Since $E(x_i)$ is a normalized error vector, the error tolerance $\epsilon$ may be assigned any small positive number less than $10^{-4}$, for example.

In order to accurately and efficiently utilize the process of FIG. 4 an accurate and efficient computation of the Jacobian matrix $J(x_i)$ is absolutely necessary. If the function $F(x_i)$ is explicitly defined in terms of $x_i$ as the vector function $G(x)$ is defined in terms of x, the Jacobian matrix would be easily obtained by directly applying partial differentiation to the explicit terms. Unfortunately, $F(x_j)$ is implicitly defined in terms of K evaluations of (3) and (5), making the computation of the Jacobian matrix a tedious and indirect process.

Algorithms in the prior art compute the Jacobian matrix associated with the error function defined in (6). These algorithms center on establishing sensitivity circuits to aid in the computation of the Jacobian matrix. In other approaches the sensitivity circuit is obtained through the adjoint network approach while still other approaches obtain the sensitivity circuit through direct partial differentiation of the laws of interconnection, i.e., Kirchhoff's Voltage Law and Kirchhoff's Current Law, and the laws of the elements, i.e., functions relating the voltage and current of individual elements. These prior art algorithms, all assume that the time duration $t_k$ spent in any kth topology is a relatively insensitive function of the initial state vector $x_i$. While this assumption holds for most open-loop systems, its validity is in question for a closed-loop regulated system where the timing of the system is a highly sensitive function of the initial state vector due to the closed-loop feedback.

SUMMARY OF THE INVENTION

A method of accelerating the pace at which circuit simulators are able to converge to a steady state solution of a periodic piecewise-linear system or periodically driven piecewise-linear system transforms the problem into finding the solution of a nonlinear function in terms of a state vector, which is then solved by a truncated power series such as the Newton-Raphson iterative procedure. Usage of this method requires the determination of system sensitivity with respect to the state vector. This system sensitivity is determined by solving for the sensitivity of the state vector at the exit of each subinterval of the periodic cycle with respect to the state vector at the entry of the same subinterval. This sensitivity is accurately resolved by considering the sensitivity of the time duration spent in this subinterval with respect to the state vector at the entry of the same subinterval. The sensitivity of time duration is factored into the computation process by computing a subinterval Jacobian matrix for each subinterval. This subinterval Jacobian matrix is computed by adding a subinterval correction matrix to a subinterval state transition matrix to account for changes in subinterval time duration. The cyclic Jacobian matrix for the entire periodic cycle is computed and utizlied in an iteration procedure to adjust a value of the initial state vector.

BRIEF DESCRIPTION OF THE DRAWING

FIG. 13 discloses a simulator system for computing steady state solutions to periodic piecewise-linear systems.

DETAILED DESCRIPTION

Figure 1:
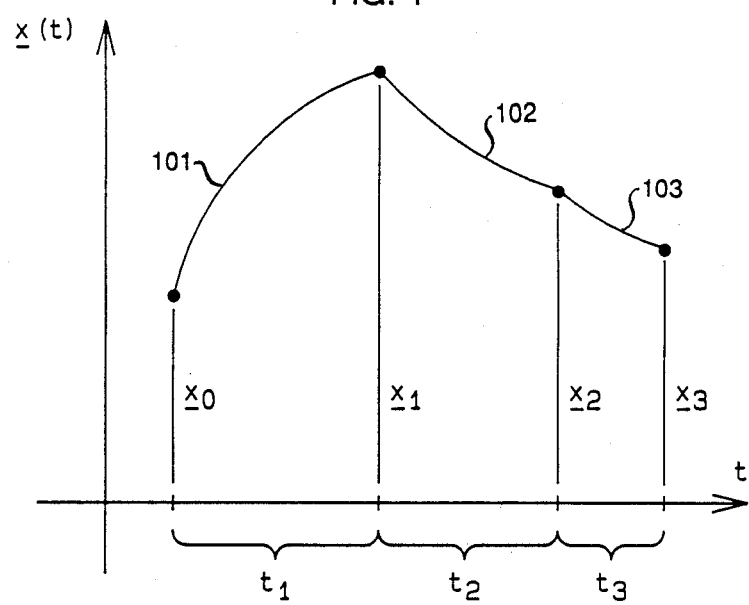
FIG. 1 discloses a hypothetical state vector trajectory of a switching system with three different switched topologies in one switching cycle.
Figure 2:
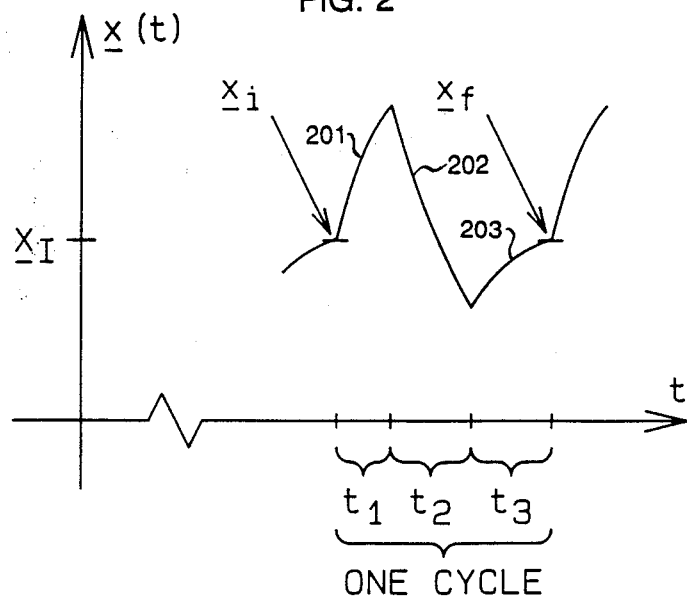
FIG. 2 discloses a state vector trajectory for a switching system that has achieved steady state operation where the initial state vector is identical to the final state vector.
Figure 3:
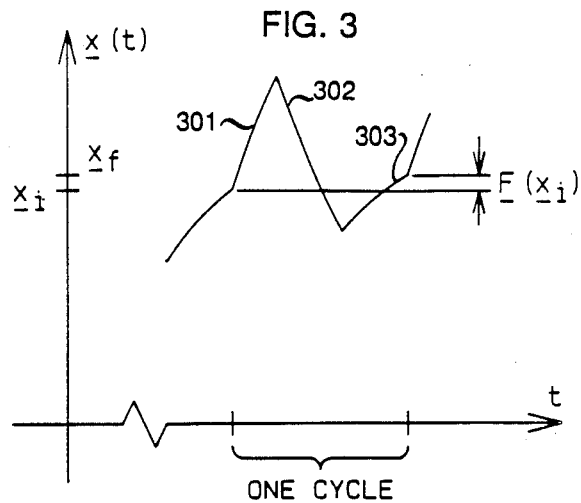
FIG. 3 discloses a state vector trajectory for a single state-variable switching system that has not achieved steady-state operation.

A new method for the computation of the Jacobian matrix $J(x_i)$ facilitates an accelerated convergence to the steady-state solution of a periodic piecewise-linear system by more accurately computing sensitivity matrices by taking into consideration the variation of the timing of subinterval duration at the cycle with respect to changes in the state vector. An algorithm based on the solutions to the differential equations in (1) and the solutions to the algebraic equations in (5) is utilized for the computation of the Jacobian matrix $J(x_i)$. Because of the special emphasis placed on the solution to the transcendental equations in (5), this algorithm is able to accurately compute the Jacobian matrix even when the timing of the sytem is a very sensitive function of the initial state $x_i$.

From the definition of the Jacobian matrix in (8) and the definition of the error function $F(x_i)$ in (6), the direct consequence is $$J(x_i) = \frac{\partial F(x_i)}{\partial x_i^T} = \frac{\partial x_f}{\partial x_i^T} - I \tag{13}$$

Since $X_0 = x_i$ and $x_K = x_f$, (13) can be rewritten as $$J(x_i) = \frac{\partial x_K}{\partial x_0^T} - I \tag{14}$$

The vector $x_k$ depends on $x_{k-1}$ according to (3) for k from 1 to K, and the chain rule can be applied to obtain the term $\partial x_K/\partial x_0^T$, yielding $$J(x_i) = J_k J_{k-1} \ldots J_2 J_1 - I \qquad (15)$$

where $$J_k = \frac{\partial x_k}{\partial x_{k-1}^T} \quad 1 \leq k \leq K \qquad (16)$$

Each sensitivity matrix $J_k$ defined in (16) shows how $x_k$, the value of the state vector at the exit of the kth topology, changes with respect to changes in $x_{k-1}$, the value of the state vector at the entry to the same topology. From now on, the matrix $J(x_i)$ is referred to either as the Jacobian matrix or the steady-state sensitivity matrix, so as not to be confused with the individual interval sensitivity matrix $J_k$.

To determine each interval sensitivity matrix $J_k$, the partial derivative $\partial x_k/\partial x_{k-1}^T$ can be computed from (3) to (5). By applying partial differentiation to both sides of (3) with respect to $x_{k-1}$, the following is obtained $$\frac{\partial x_k}{\partial x_{k-1}^T} = \frac{\partial}{\partial x_{k-1}^T} \{\phi_k(t_k) x_{k-1} + A_k^{-1}[\phi_k(t_k) - I]B_k u\} \qquad (17)$$

Among the terms inside the braces in (17), only the state vector $x_{k-1}$ and the state transition matrix $\phi_k(t_k)$, have variational components when $x_{k-1}$ changes because $A_k$, $B_k$, and u are independent of the state vector. The state transition matrix $\phi_k(t_k)$ is a function of $x_{k-1}$ because $t_k$ dependent on $x_{k-1}$ through the implicit relationship in (5). Expanding the partial differential operations by applying the product rule and chain rule to (17) gives $$\frac{\partial x_k}{\partial x_{k-1}^T} = \phi_k(t_k) \frac{\partial x_{k-1}}{\partial x_{k-1}^T} + \frac{\partial \phi_k(t_k)}{\partial t_k} x_{k-1} \frac{\partial t_k}{\partial x_{k-1}^T} + \qquad (18)$$

$$A_k^{-1} \frac{\partial \phi_k(t_k)}{\partial t_k} B_k u \frac{\partial t_k}{\partial x_{k-1}^T}$$

Naturally, the derivative $\partial x_{k-1}/\partial x_{k-1}^T$ gives the identity matrix and $\partial \phi_k(t_k)/\partial t_k$ is equal to $A_k \phi_k(t_k)$ because $\phi_k(t_k)$, by definition (4), is the state transition matrix. Therefore, (18) can be recast as $$\frac{\partial x_k}{\partial x_{k-1}^T} = \phi_k(t_k) + A_k \phi_k(t_k) x_{k-1} \frac{\partial t_k}{\partial x_{k-1}^T} + \phi_k(t_k) B_k u \frac{\partial t_k}{\partial x_{k-1}^T} \qquad (19)$$

Since multiplication between a square matrix $A_k$ and its state transition matrix $\phi_k(t_k)$ is commutative (19) is further regrouped as $$\frac{\partial x_k}{\partial x_{k-1}^T} = \phi_k(t_k) + \phi_k(t_k)[A_k x_{k-1} + B_k u] \frac{\partial t_k}{\partial x_{k-1}^T} \qquad (20)$$

As is evident from (20), the interval sensitivity matrix $\partial x_k/\partial x_{k-1}^T$ is composed of two terms. The first term is the state transition matrix $\phi_k(t_k)$ for the kth interval for the time duration $t_k$, and it affects $\partial x_k/\partial x_{k-1}^T$ under all conditions. The second term, however, affects the interval sensitivity matrix only when the time duration for the interval depends on changes in the state vector, thereby producing a partial derivative $\partial t_k/\partial x_{k-1}^T$ which is no longer a null row vector. In other words, if $t_k$, the time of duration of the interval, is independent of the initial state vector $x_{k-1}$ upon entering the interval, then the second term is a null matrix. Therefore, the second term can be recognized as a correction square matrix $\Gamma_k$ to account for the variation in the interval sensitivity matrix due to timing. Thus, $$J_k = \frac{\partial x_k}{\partial x_{k-1}^T} = \phi_k(t_k) + \Gamma_k \qquad (21)$$

where $$\Gamma_k = \phi_k(t_k)[A_k x_{k-1} + B_k u] \frac{\partial t_k}{\partial x_{k-1}^T} \qquad (22)$$

Since existing algorithms for computing the Jacobian matrix $J(x_i)$ neglect the variation of the timing with respect to changes in the state vector, they have the same effect as dropping the correction term $\Gamma_k$ from (21), thus leading to erroneous entries to the Jacobian matrix $J(x_i)$ for certain systems.

Figure 5:
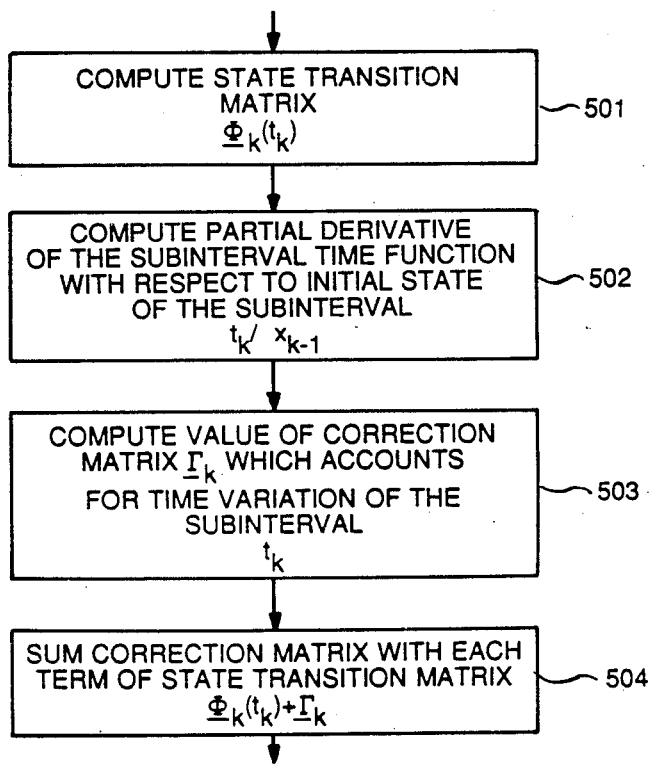
FIG. 5 discloses a sub block flow process which is part of the flow process of FIG. 4.
Figure 4:
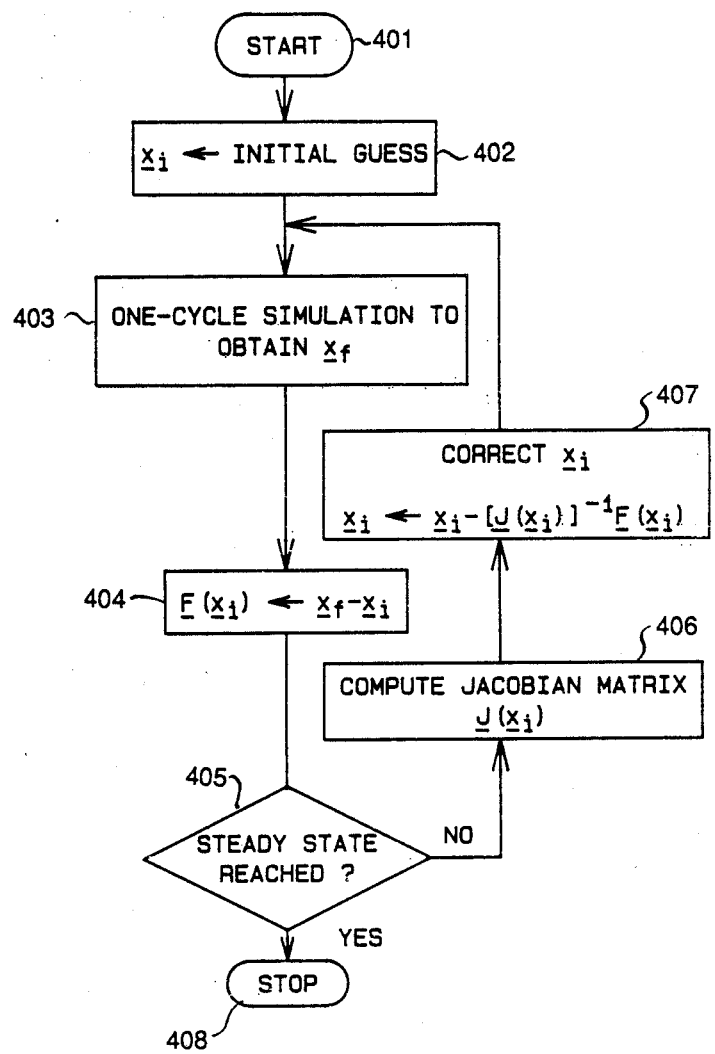
FIG. 4 discloses a block flow process to achieve a steady state solution.

The acceleration procedure is disclosed in FIG. 5 which illustrates a block flow diagram of the accelerated computation of the subinterval $J_x(x_k)$ matrix which is depicted in block 407 of FIG. 4. The state transition matrix $\phi_k(t_k)$ is computed in block 501 in the conventional manner. A partial derivative $\partial J_k/\partial_{k-1}$ is computed in block 502 with respect to the initial state vector of the present interval. The value of a correction matrix $\Gamma_k$ is computed in block 503 to account for time variations of the subinterval $t_k$. The correction matrix $\Gamma_k$ is summed in block 504 with the state transition matrix $\phi_k(t_k)$ to obtain the corrected Jacobian matrix $J_k(x_k)$. The subinterval matrices for each subinterval are combined to obtain the cyclic Jacobian matrix as in equation (15). The subprocess is followed by the Newton-Raphson iteration process block 408 in FIG. 4 to calculate a new initial state vector.

Figure 6:
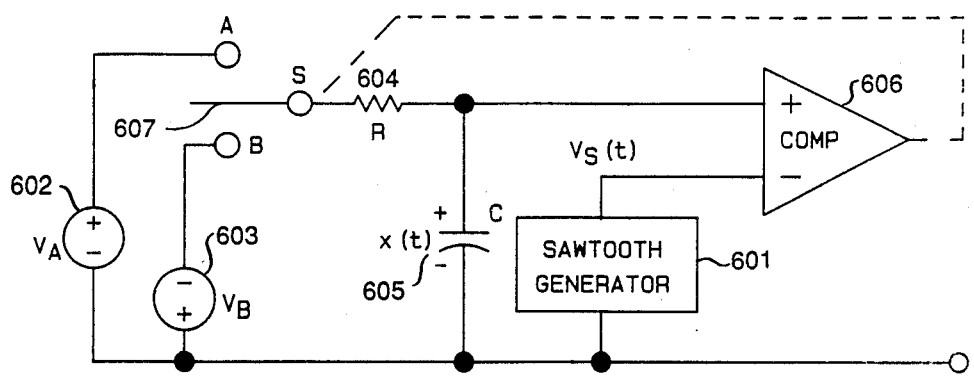
FIG. 6 discloses an illustrative two topology switching network useful in describing an application of the process of achieving a steady state solution to switching systems.

To see the impact of neglecting the variation of timing with respect to changes in the state vector, one can look at a simple hypothetical system represented in FIG. 6. FIG. 6 discloses a simple two topology network with variable timing.

Figure 7:
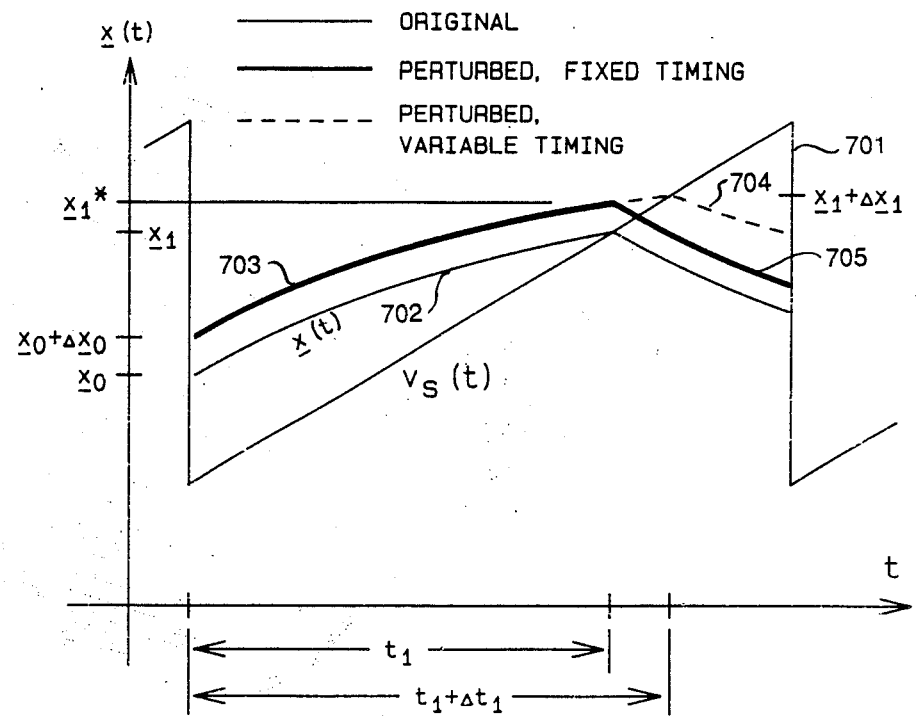
FIG. 7 shows waveforms in the various solutions of the network of FIG. 6 using different methods.

This system is composed of a sawtooth function generator 601, two voltage sources 602 and 603, a resistor 604, a capacitor 605, a voltage comparator 606 and a switch 607 is driven by the voltage comparator. Waveforms for various steady-state solutions of one circuit are shown in FIG. 7. At the start of a switching cycle, as denoted by the abrupt drop in the sawtooth voltage 701, the switch S 607 is driven to position A and the capacitor C 605 is charged by the voltage source $V_A$ 602 through resistor R 604. Switch SW 607 remains at A until the capacitor voltage x(t) 702 intersects the voltage of the sawtooth generator $v_s(t)$, at which time S 607 os switched to position B, charging the capacitor 605 toward a voltage of $-V_B$. This is a very simple two-topology switching circuit which resembles very much the action that is typically encountered in a closed-loop regulated switching-mode system. A typical waveform for the capacitor voltage is indicated by the solid line 702 in FIG. 7. The time duration spent in the first topology is marked $t_1$ according to the convention stated earlier.

Now suppose the capacitor 605 has an initial voltage of $x_0 + \Delta x_0$, instead of $x_0$, at the entry to the 1st topology. Due to the variation $\Delta x_0$ of the capacitor voltage from its original value at the entry of the 1st topology, the time duration that the system spent in the 1st topology increases according to the control law described. As a result, the capacitor will be charged for a time duration of $t_1 + \Delta t_1$. Hence, the waveform of the capacitor voltage will follow the bold solid line 703 in FIG. 7 up to $t_1$, and then follow the dashed line 704 for the remaining part of the switching cycle. The bold solid waveform including line 705 is the waveform of the capacitor voltage if there is a variational change $\Delta x_0$ in the beginning of the switching cycle, but the additional time $\Delta t_1$ required by the control law is not accounted for in the mathematical prediction. Thus, an algorithm neglecting the variation of $t_1$ with respect to changes in $x_0$ predicts a variation of $x_1 = \mathbf{x1}$ at the end of the 1st topology which is less than the actual variation indicated by the diagram as equal to $\Delta x_1$. This error is further magnified after propagation through the 2nd topology as shown in FIG. 7. Thus, it is absolutely essential to take into consideration the variation of the timing with respect to changes in the initial state vector in computing the sensitivity of the steady state with respect to the state vector.

If $t_k$ is affected by $x_{k-1}$, then the p derivative $\partial t_k / \partial x_{k-1}^T$ has to be computed. The computation of this derivative must be based on an equation that determines the exit values of the system on leaving the kth topology. As explained above, the reason that the system leaves the kth topology is due to the fact that a certain output variable, say the qth component of the output vector, drops from a positive to zero, signaling a switch in the system topology. In a manner similar to the way (20) is obtained from (3), partial differentiation is applied to both sides of (5) with respect to $x_{k-1}$, giving a $$0 = (C_k)_q \phi_k(t_k) + (C_k)_q \{\phi_k(t_k)[A_k x_{k-1} + B_k u]\} \frac{\partial t_k}{\partial x_{k-1}^T} \quad (23)$$

Rearranging terms in (23) gives $$\frac{\partial t_k}{\partial x_{k-1}^T} = \frac{-(C_k)_q \phi_k(t_k)}{(C_k)_q \{\phi_k(t_k)[A_k x_{k-1} + B_k u]\}} \quad (24)$$

The numerator in (24) is a row vector, while the denominator is a scalar, giving the derivative $\partial t_k / \partial x_{k-1}^T$ the dimensions of a $1 \times n$ row vector. The interval sensitivity matrix $J_k$ for the kth topology can then be computed from (20) and (24).

After the interval sensitivity matrix $J_k$ for each of the K topologies has been computed the Jacobian matrix $J(x_i)$ can be computed from (15). Once the Jacobian matrix is obtained, the Newton-Raphson iteration illustrated in FIG. 4 can be applied to predict the correction term $\Delta x_1$ in converging to the steady-state solution of the system. Thus, the computation of the Jacobian matrix is equivalent to carrying out n more cycles of simulation, albeit with some special initial conditions. The full advantage of the accelerated convergence given by the simulator procedure of the invention may be ascertained by a numerical example in which steady-state solution of the circuit of FIG. 6 are obtained by brute force method, Newton-Raphson iteration without taking time interval variation into account and iteration with a Jacobian matrix including time interval variation consideration.

For the studies carried out in this example, the sawtooth voltage $v_s(t)$ swings from $-2.5$ V at the beginning of switching cycle to 2.5 V at the end of the switching cycle. The switching period is equal to 10 $\mu s$ and the capacitance of the capacitor is 0.1 $\mu F$. Two studies are carried out, one for the case when R is equal to 1000 $\Omega$ and another one for the case when R is equal to 2000 $\Omega$.

For each of the two studies, three simulations are performed, all starting from the initial condition on the capacitor voltage set to zero. The first simulation is a brute-force simulation without applying any special algorithm to accelerate the convergence toward steady state. In the second and third simulations, Newton-Raphson iteration and the Jacobian matrix are applied as discussed above to accelerate the steady-state convergence. The Jacobian matrix, in the second simulation, however, is computed from (15) and (21), neglecting $\Gamma_k$ for both topologies. That is, the Jacobian matrix is computed without taking into account timing variation. In essence, the Jacobian matrix is obtained in a manner equivalent to the way the Jacobian matrix is computed by existing algorithms. The third simulation is similar to the second one, with the exception that the Jacobian matrix is obtained through (15), (20), and (24), taking into account the possibility of variation in system timing.

TABLE I

| CPU TIME REQUIRED FOR FIRST EXAMPLE | | |
|---|---|---|
| | R = 1000$\Omega$ | R = 2000$\Omega$ |
| Brute-Force Simulation | 8.907 S | 15.29 S |
| Newton-Raphson iteration without taking into account timing variation | 0.805 S | 0.697 S |
| Newton-Raphson iteration with Jacobian matrix computed from new algorithm | 0.058 S | 0.055 S |

The required computation times taken by these three algorithms in reaching steady state for R equal to 1000 $\Gamma$ and 2000 $\Gamma$ are tabulated in Table 1. Both the second and the third algorithms require much less computation time compared to the brute-force simulation. The importance of taking into consideration the variation in the system timing is evident in this study. The third simulation, which computes the Jacobian matrix through the new algorithm, is able to converge to the steady-state solution at a speed 10 times faster than the second simulation. This is not so surprising a result since there is no correction to account for the variation in system timing in the second simulation, thus pointing the system to an erroneous direction to search for steady-state.

Figure 8:
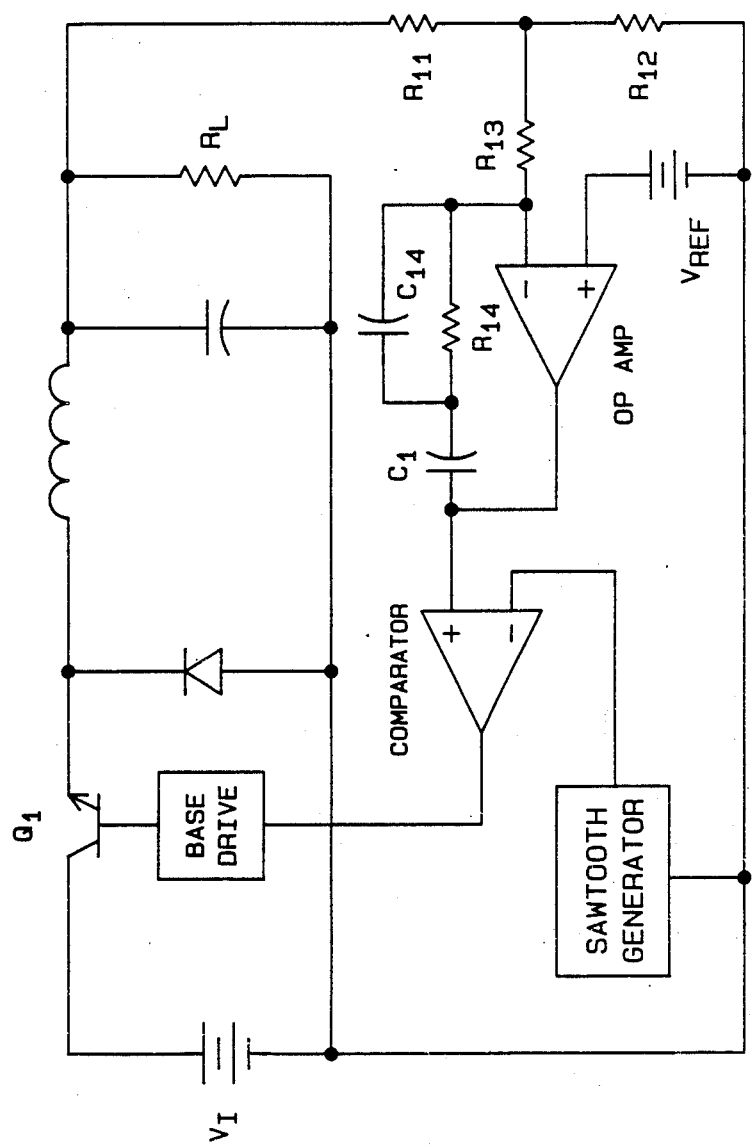
FIG. 8 is a schematic diagram of a typical closed-loop regulated converter which may be solved by the method of the invention.
Figure 9:
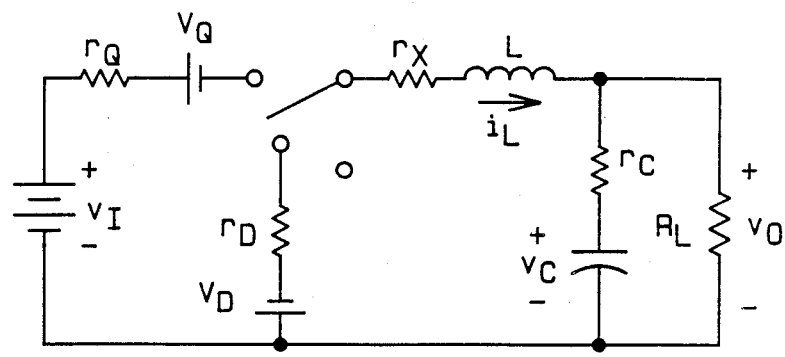
FIG. 9 is a schematic of a piecewise-linear model of the power stages of the converter of FIG. 8.

A closed loop regulated converter is shown schematically in FIG. 8. A piecewise-linear model of the power stage of this circuit is shown in FIG. 9. This is a more specific and actual circuit type example then the first example shown in FIG. 6.

The parameters associated with the power stage and the controller of this converter are listed in Table 2.

TABLE 2
PARAMETERS FOR THE CONVERTER IN THE SECOND EXAMPLE

| | | | | | |
|---|---|---|---|---|---|
| C | 50 μF | $\Gamma_X$ | 0.01Γ | VI | 40V |
| $C_1$ | 0.1 μF | $R_L$ | 5Ω or 25Ω | $V_Q$ | 0.7V |
| C14 | 1000 pF | $R_{11}$ | 40kΩ | $V_{REF}$ | 2.5V |
| L | 40 μH | $R_{12}$ | 10kΩ | $T_S$ | 10 μS |
| ΓC | 0.05Ω | $R_{13}$ | 10kΩ | Sawtooth | |
| ΓD | 0.1Ω | $R_{14}$ | 2kΩ | Generator: | |
| ΓQ | 0.1Γ | $V_D$ | 0.7V | 0 to 5V | |

Figure 10:
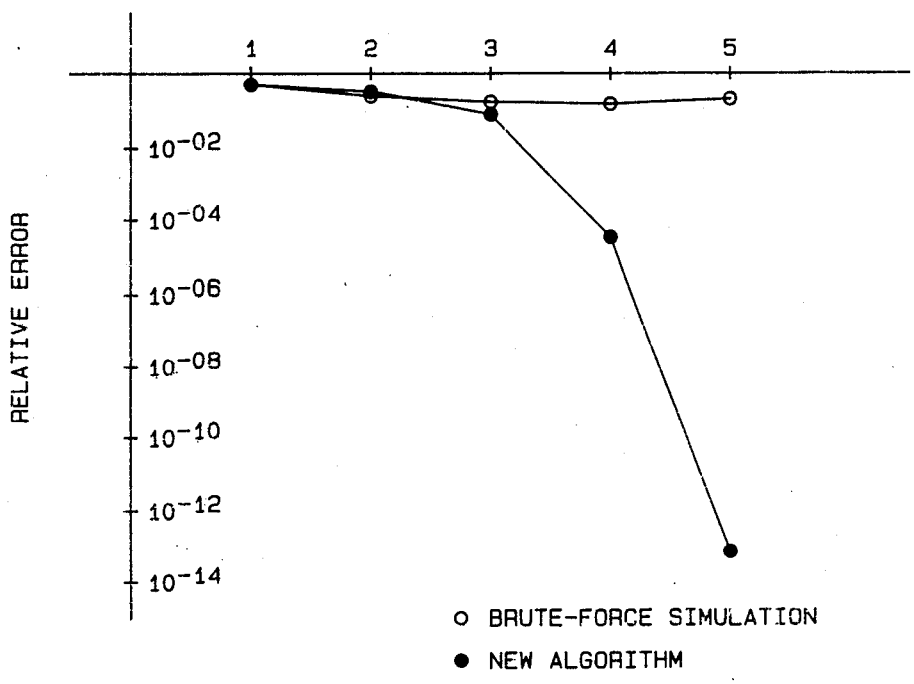
FIG. 10 is a graph of the Euclidian norm of relative error after each pair of the simulation process.
Figure 11:
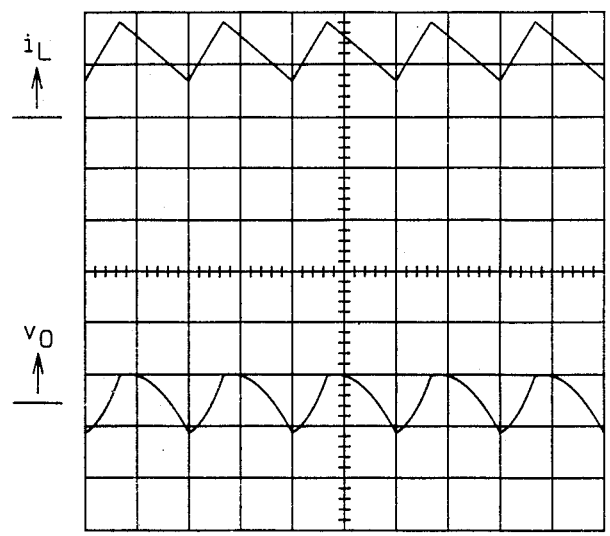
FIGS. 11 and 12 disclose steady-state waveform for various parameters of the system shown in FIG. 8.

Initially the load $R_L$ is set at 5 Ω. Two simulations are carried out to reach the steady state, both starting from an initial state where all state variables are set to zero. The first simulation is a brute-force simulation while the second one is aided by Newton-Raphson iteration with the Jacobian matrix computed from (15), (20), and (24) according to the new algorithm. The CPU times required to reach steady state are tabulated in Table 3. The new algorithm is seen to enjoy a 17 times improvement in computation speed in converging to the steady state. In FIG. 10, the Euclidean norm of the relative error of $F(x_i)$ is plotted against the number of passes of simulation required. Using brute-force simulation, the relative error improves very little after 5 passes of simulation. On the other hand, Newton-Raphson iteration with the Jacobian matrix computed according to the new algorithm is able to significantly reduce the relative error on each pass of simulation. The CPU time required by each pass of the new algorithm, however, is longer than that required by the brute-force simulation since the various sensitivity matrices and the Jacobian matrix have to be computed. Table 4 provides the values of the state variables at the beginning of the switching cycle after steady state has been reached while FIG. 11 shows the steady-state waveforms, as obtained from the simulation, for the inductor current and the output voltage. No comparison is made with the Newton-Raphson iteration method where interval timing variation are not taken into account because that method failed to converage when applied to the circuit of FIG. 9.

TABLE 3
CPU TIME REQUIRED

| | $R_L = 5\Gamma$ | $R_L = 25\Gamma$ |
|---|---|---|
| Brute-Force Simulation | 34 S | 59 S |
| Newton-Raphson iteration with Jacobian matrix computed from new algorithm | 2 S | 2 S |

TABLE 4
STEADY-STATE INITIAL VALUES FOR $X_I$

| | $R_L = 5\Omega$ | $R_L = 25\Omega$ |
|---|---|---|
| $i_L$ | 1.385A | 0A |
| $v_{CI}$ | −0.8159V | −1.384V |
| $v_{CI4}$ | 0.3863 mV | 0.5381 mV |
| $v_C$ | 12.49V | 12.48V |

Figure 12:
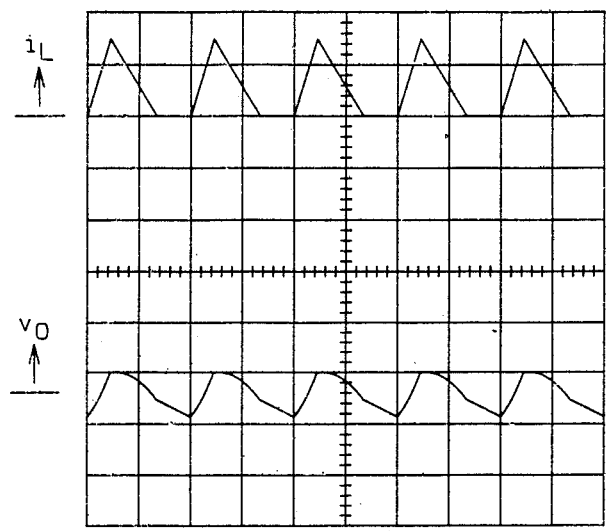

In a second study applied to the piecewise-linear model of FIG. 9 the load resistance $R_L$ is raised to 25 Ω moving the operation of the converter from continuous-mmf mode. Again, steady-state solutions are sought through simulations from zero initial state. The required CPU times are tabulated in the final column of Table 3. The values of the state variables at the beginning of the switching cycle after steady state has been reached are provided in the right-hand column of Table 4 while the steady-state waveforms for the inductor current and the output voltage are shown in FIG. 12. This study shows that the Newton-Raphson iteration with the Jacobian matrix computed from the new algorithm is able to reach the steady-state solution about 30 times faster than the brute-force simulation.

A circuit simulator is shown in FIG. 13 which solves for the steady-state solutions of periodic piecewise-linear systems. One input device 11 accepts the circuit parameters while a second input device 12 permits input of an initial state vector for the circuit. The circuit simulation processor 13, which may comprise a general purpose data processor suitably programmed, is set up to the system totology and in response to the parameter and state vector inputs simulates steady-state operation and claculates a final state vector for one periodic cycle of the periodic piecewise-linear system. It compares the cyclic initial and final state vector to see if the solution is truly steady state. If steady state is not achieved entry and exit vectors for each subinterval of the system being simulated are compared in comparative 16. State transition matrices and correction matrices are computed in a processor 15. Processor 15 may utilize the processing capability of processor 13. From these matrices a cyclic Jacobian matrix is generated and applied to a claculator 16 which uses power series methods such as the Newton-Raphson procedure to calculate a new initial state vector. The process is continued and a new steady state condition evaluated until agreement between the initial and final cyclic state vectors is satisfactory as determined in the steady state simulation 13. This method of obtaining steady-state solution of periodic piecewise-linear systems is significantly faster than the previous method of obtaining steady-state solutions. It includes a new faster method of computing the Jacobian matrix involved in accelerating calculation to coverge toward the steady state of regulated switching-mode systems. By applying Newton-Raphson iteration after the Jacobian matrix is obtained, the new algorithm is able to home in on the steady-state solution at a rate faster than that achieved by brute-force simulation by more than one order of magnitude.

There are two key features in this new algorithm. By taking advantage of the solution to the piecewise-linear differential equations, as formulated in (3), there is not much overhead required in the computation of the Jacobian matrix. By taking into account the variation in the system timing with respect to changes in the state vector, i.e., adding the correction matrix $\Gamma_k$ in (21), the new algorithm is able to handle systems which have very sensitive timing with respect to the state vector. Another advantage of this algorithm is in its conceptual simplicity. The only concepts that one need employ are the ability to solve (1) and (2) and a knowledge of matrix algebra.

GLOSSARY OF SYMBOLS $A_k$: plant coefficient matrix associated with the kth topology $B_k$: control matrix associated with the kth topology $C_k$: C matrix associated with the kth topology $D_k$: D matrix associated with the kth topology $E(x)$: Relative error function, the qth component of $E(x_1)$ is equal to the qth component of $F(x_1)$ normalized by the qth component of $X_N$ $F(x_i)$: error function, equal to $x_f - x_1$ $J(x_1)$: Jacobian matrix of $F(x_1)$ with respect to $x_i$, also known as steady-state sensitivity matrix $J_k$: sensitivity matrix associated with the kth topology k: index to describe topology $x_{k-1}$: the value of the state vector at the entrance to the kth topology $x_k$: the value of the state vector at the exit of the kth topology $X_N$: Normalizing vector 5, entries are expected maximum magnitude of corresponding state variables V: output vector $y_{k-1}$: the value of the output vector at the entrance of the kth topology $y_k$: the value of the output vector at the exit of the kth topology u: input vector $\phi_k(t_k)$: state transition matrix $e^{A_k t_k}$ $(k)_q$: the qth row of k, k is either a vector or a matrix $\Gamma_k$: the correction term to $J_k$ to account for the variation in $t_k$, a square matrix

I claim:

1. A method for simulating with a circuit simulation processor a steady state operation of a periodic piece-wise linear switched system having a plurality of switched states;

comprising the steps of:

defining a cycle of operation of the switched system;

defining subintervals of the cycle in which different switched states in the switching system define a different system topology in the different subintervals;

determining an initial value of a state vector for the periodic piece-wise linear switched system at the beginning of the cycle;

simulating a single cycle of operation to obtain a final value of the state vector for the periodic piece-wise linear switched system at the end of the cycle;

comparing the initial and final values of the state vector to determine if a steady state condition in the simulation of operation has been achieved;

wherein the improvement comprises:

computing a subinterval Jacobian matrix for each subinterval by computing a subinterval state transition matrix; and adding a correction square matrix to the subinterval state transition matrix to account for changes in subinterval time durations;

computing a cycle Jacobian matrix by subtracting an identity matrix from a product of all computed subinterval Jacobian matrices;

adjusting the value of the initial value of the state vector to a new value form the computed cycle Jacobian matrix through a truncated power-series procedure; and repeating the above described steps subsequent to the step of determining an initial value until steady state simulation is achieved.

2. A method for simulating a steady state operation of a periodic piece-wise linear switched system as claimed in claim 1, wherein the truncated power-series procedure uses a Newton-Raphson iterative procedure.

3. An apparatus for modeling an operation of a periodic piece-wise linear system to a predetermined accuracy; comprising:

first input means for accepting and setting up a specific topology for each switched subinterval occurring in each cycle of operation of the periodic piece-wise linear system;

second input means for accepting an initial value of a state vector for the periodic piece-wise linear system at the beginning of a cycle of operation of the periodic piece-wise linear system;

means for simulating a single cycle of operation of the periodic piece-wise linear system to obtain a final value of the state vector for the wise linear system to obtain a final value of the state vector for the periodic piece-wise linear system at the end of the cycle;

means for comparing the initial and final values of the state vector to determine if a steady state operating condition has been achieved;

wherein the improvement comprises;

means for dividing each cycle into a plurality of subintervals for each switched subinterval of the periodic piece-wise linear system and computing a subinterval Jacobian matrix for each subinterval by computing a subinterval state transition matrix; and adding a correction square matrix to the subinterval state transition matrix to account for changes in subinterval time durations;

means for computing a cycle Jacobian matrix by subtracting an identity matrix from a product of all computed subinterval Jacobian matrices;

means for adjusting the value of the initial value of the state vector to a new value from the computed cycle Jacobian matrix through a truncated power-series procedure;

means for repeating the above described opertions until the predetermined accuracy of steady state operation is achieved.

4. An apparatus for modeling an operation of a periodic piece-wise linear system to a predetermined accuracy as defined in claim 3 wherein the periodic piece-wise linear system comprises a closed-loop regulated switching mode system.

5. An apparatus for modeling an operation of a periodic piece-wise linear system to a predetermined accuracy as defined in claim 3 wherein the periodic piece-wise linear system comprises a periodically driven piece-wise-linear system.

6. A method for simulating steady state operation of a periodic piece-wise switched linear system and where the switched linear system is modeled by k different switching topologies and the system being piece-wise linear in each individual topology, the method comprising the steps of:

defining a cycle of operation of the switched system;

defining k subintervals of the cycle in which different switched states in the switched linear system define a different system topology in the different subintervals;

describing the system by a linear vector differential equation $$dx/dt = A_k x + B_k u$$

and a linear vector algebraic equation $$Y = C_k x + D_k u$$

for each of the k different topologies;

selecting an initial state vector $x_i$ of the system for the beginning of a cycle of opertion of the system;

simulating a single cycle of operation to calculate a final state vector $x_f$ of the system for the ending of a cycle of operation of the system;

defining a change in the state vector over one switching cycle by defining the vector function $$F(x_i) = x_f - x_i$$

in terms of the initial state vector $x_i$ and the final state vector $x_f$;

wherein the improvement comprises:

continuing with the following steps if $x_f$ does not equal $x_i$:

calculating an individual subinterval sensitivity matrix $J_k$ for each piece-wise linear subinterval of the cycle by computing a state transition matrix $\omega k(tk)$ and a correction square matrix $r_k$ and $$J_k = \omega_k(t_k) + r_k$$

to account for variations in subinterval time durations;

computing a steady-state Jacobian matrix $J(x_i)$ by the operation $$J(x_i) = J_k J_{k-1} \ldots J_2 J_1 - I;$$

correcting the value of the initial state vector $x_i$ by the j operation $$x < x_i - [J(x_i)]^{-1} F(x_i);$$

repeating the above step of simulating s single cycle of operation to calculate a final state vector $x_f$ of the system and continuing subsequent steps until $x_f$ substantially equal $x_i$.

7. A circuit simulator for modeling the cyclic steady state operation of a piece-wise linear closed loop regulated switching mode power circuit having a plurality of switched states in each cycle each of which define a different topology of the circuit each topology being operative within a separate subinterval of the cycle, composing:

a first input device for accepting values of the circuit system parameters, a second input device for accepting an initial value of a state vector for the circuit system at the beginning of a cycle of operation, a circuit system processor set up in the separate subintervals for the circuit system topologies of each separate subinterval whose operation is to be simulated over a cycle of operation, including;

a steady state simulator operative for simulating steady state operation of the circuit system and for calculating a final state vector at an end of one periodic cycle of opertion of the circuit system, and having;

means for computing a subinterval Jacobian matrix for each separate subinterval of the cycle by computing a subinterval state transition matrix; and adding a correction square matrix to the subinterval state transition matrix to account for changes in subinterval time durations;

means for computing a cycle Jacobian matrix by subtracting an identity matrix from a product of all computed subinterval Jacobian matrices;

a comparator for comparing the initial state vector and the final state vector as a means of determining if steady state simulation has been achieved, means for adjusting the value of the initial value of the state vector to a new value from the computed cycle Jacobian matrix through a truncated power-series precedure and applying the new value to simulate anew a cycle of operation of the circuit system.

* * * * *